United States Patent
Goolsby et al.

(10) Patent No.: US 7,361,561 B2
(45) Date of Patent: Apr. 22, 2008

(54) METHOD OF MAKING A METAL GATE SEMICONDUCTOR DEVICE

(75) Inventors: Brian J. Goolsby, Austin, TX (US); Bruce E. White, Round Rock, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 403 days.

(21) Appl. No.: 11/166,138

(22) Filed: Jun. 24, 2005

(65) Prior Publication Data

US 2006/0292773 A1    Dec. 28, 2006

(51) Int. Cl.
*H01L 21/336* (2006.01)
(52) U.S. Cl. ............... 438/287; 257/E21.625
(58) Field of Classification Search ............. 438/287, 438/657; 257/E21.625
See application file for complete search history.

(56) References Cited

U.S. PATENT DOCUMENTS 6,268,253 B1 * 7/2001 Yu ............................ 438/287
6,686,248 B1 * 2/2004 Yu ............................ 438/287
6,717,226 B2 * 4/2004 Hegde et al. ............... 257/406

* cited by examiner

Primary Examiner—Chandra Chaudhari
(74) Attorney, Agent, or Firm—James L. Clingan, Jr.; Cindy R. Simpson

(57) ABSTRACT

A patterned polysilicon gate is over a metal layer that is over a gate dielectric layer, which in turn is over a semiconductor substrate. A thin layer of material is conformally deposited over the polysilicon gate and the exposed metal layer and then etched back to form a sidewall spacer on the polysilicon gate and to re-expose the previously exposed portion of the metal layer. The re-exposed metal layer is etched using an etchant that is selective to the gate dielectric material and the sidewall spacer. Even though this etch is substantially anisotropic, it has an isotropic component that would etch the sidewall of the polysilicon gate but for the protection provided by the sidewall spacer. After the re-exposed metal has been removed, a transistor is formed in which the metal layer sets the work function of the gate of the transistor.

20 Claims, 3 Drawing Sheets

METHOD OF MAKING A METAL GATE SEMICONDUCTOR DEVICE

FIELD OF THE INVENTION

This invention relates to integrated circuits, and more particularly to forming a semiconductor device having a metal gate.

BACKGROUND OF THE INVENTION

Polysilicon has been the gate of choice for MOS transistors for many years. As the gate dielectrics have become thinner and/or of a higher dielectric constant (k), depletion (poly depletion) of carriers in the polysilicon adjacent to the gate dielectric, which has the effect of adding a capacitor in series with the gate dielectric, has become more significant in reducing the overall gate capacitance. A typical effect of poly depletion is to put the equivalent of 6 to 8 Angstroms of silicon oxide in series with the gate dielectric. With gate dielectrics now being able to be made with equivalents of about 10 Angstroms of silicon oxide, the poly depletion is significant to the effective overall gate dielectric thickness as measured electrically. With the improved use of high k dielectrics, the poly depletion will become an even bigger percentage of the overall effective gate dielectric thickness. Further, polysilicon has compatibility issues with many of the high k dielectrics being considered for use.

In the implementation of metal gates, much of the difficulty has been finding metals with work functions that work well for N channel and P channel transistors. Etching these metals is also an issue. Etchants that are selective between the metal and the underlying gate dielectric are useful for this purpose. The integration of the various aspects of choosing the metals for P and N channel devices, the gate dielectric, and the etchants has been difficult to achieve for reliable manufacturing.

Thus there is a need for making a metal gate semiconductor device that improves the integration of various elements used in such a process.

BRIEF DESCRIPTION OF THE DRAWINGS

The foregoing and further and more specific objects and advantages of the invention will become readily apparent to those skilled in the art from the following detailed description of a preferred embodiment thereof taken in conjunction with the following drawings.

DETAILED DESCRIPTION OF THE INVENTION

In one aspect a semiconductor device has a patterned polysilicon gate over a metal layer that is over a gate dielectric layer, which in turn is over a semiconductor substrate. A thin layer of material, preferably the same material as the gate dielectric, is conformally deposited over the polysilicon gate and over the exposed metal layer. The conformal layer is etched back to form a sidewall spacer on the polysilicon gate and to re-expose the previously exposed portion of the metal layer. The re-exposed metal layer is etched using an etchant that is selective to the gate dielectric material and the sidewall spacer. Even though this etch is substantially anisotropic, it has an isotropic component that would adversely etch the sidewall of the polysilicon gate but for the protection provided by the sidewall spacer. After the re-exposed metal has been removed, a transistor is formed in which the gate is a stack of the polysilicon gate and the unetched portion of the metal layer. This unetched portion of the metal layer sets the work function of the gate of the transistor. This is better understood by reference to the drawings and the following description.

Figure 1:
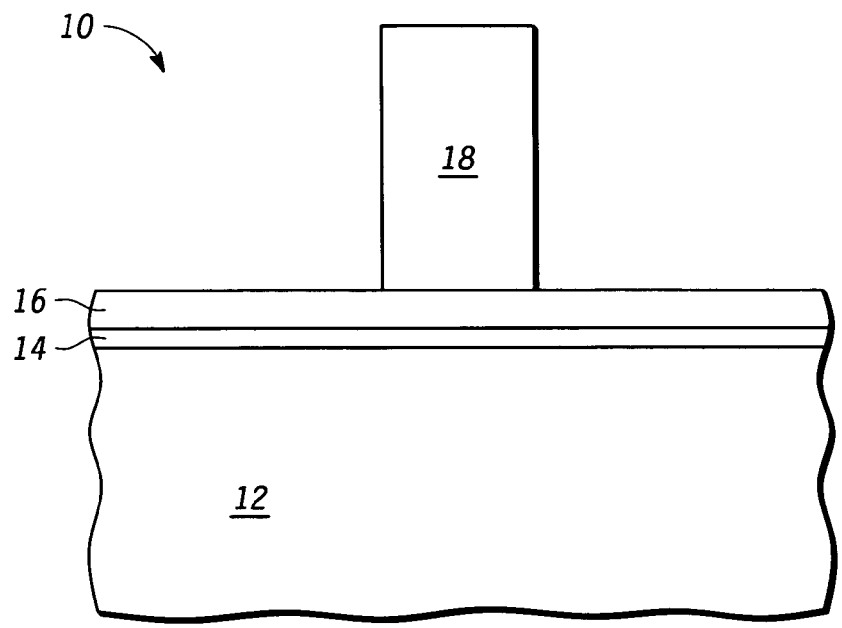
FIG. 1 is a cross section of a semiconductor structure at a stage in processing according to one embodiment.

Shown in FIG. 1 is a semiconductor device 10 comprising a semiconductor substrate 12, an insulating layer 14 on substrate 12, a metal layer 16 on insulating layer 14, and a polysilicon gate 18. This is achieved by depositing insulating layer 14 on substrate 12, depositing metal layer 16 on insulating layer 14, depositing a polysilicon layer over metal layer 16, depositing a photoresist layer, patterning the photoresist layer, then etching the polyslicon layer using the patterned photoresist layer as a mask to form polysilicon gate 18.

Substrate 12 is preferably silicon and is shown as a bulk silicon substrate but could also be a semiconductor on insulator (SOI) substrate. Insulating layer 14 is preferably hafnium oxide but could be a different high k material suitable as a gate dielectric such as a metal oxide like zirconium oxide or lanthanum silicon oxynitride. Insulating layer 14 is considered directly on substrate 12 but in fact may be separated by a very thin silicon oxide layer. Such a silicon oxide layer is almost impossible to avoid and further provides a useful interface between the substrate and the material used for insulating layer 14. Insulating layer 14 is preferably about 10 to 40 Angstroms thick. Metal layer 16 is preferably about 50 to 100 Angstroms thick and preferably comprises tantalum carbide for N channel transistors and molybdenum nitride for P channel transistors. Metal layer 16 may also comprise several different layers of metal. For example for an N channel transistor, the tantalum carbide layer would be adjacent to the gate dielectric to set the work function and the molybdenum nitride would be on the tantalum carbide. In such a case the P channels may need only have a single layer of molybdenum nitride. In the alternative, the metal layer for P channel transistors would be molybdenum nitride on the gate dielectric and tantalum carbide on the molybdenum nitride. In this case the N channel transistors may need only have a single layer of tantalum carbide. Further, in the case of two metal layers being used for metal layer 16, the metal layers chosen may react together in which case a third metal layer acting as a barrier may be interposed between them. Polysilicon gate 18 is preferably about 500 to 1000 Angstroms thick and about 100 to 400 Angstroms wide.

Figure 2:
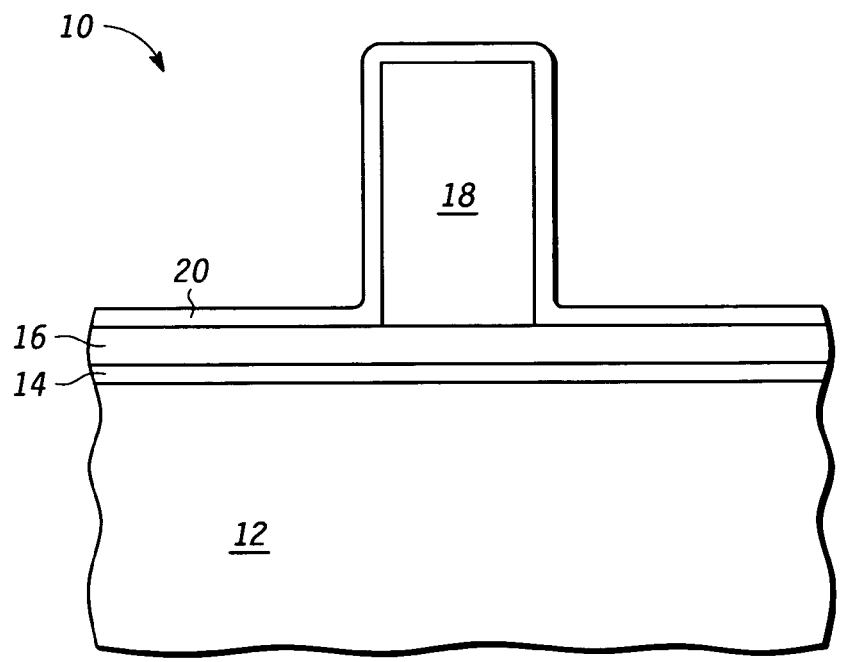
FIG. 2 is a cross section of the semiconductor structure of FIG. 1 at a subsequent stage in processing.

Shown in FIG. 2 is device structure 10 after deposition of a conformal layer 20, which is preferably the same material and thickness as insulating layer 14. Metal layer 16 thus is comprised of at least of an elemental metal and may additionally have one or more elements that may or may not be metal. The intent is for the material of metal layer 16 to set the desired work function. Metal layer 16 may thus also be referenced as a metal-containing layer.

Figure 3:
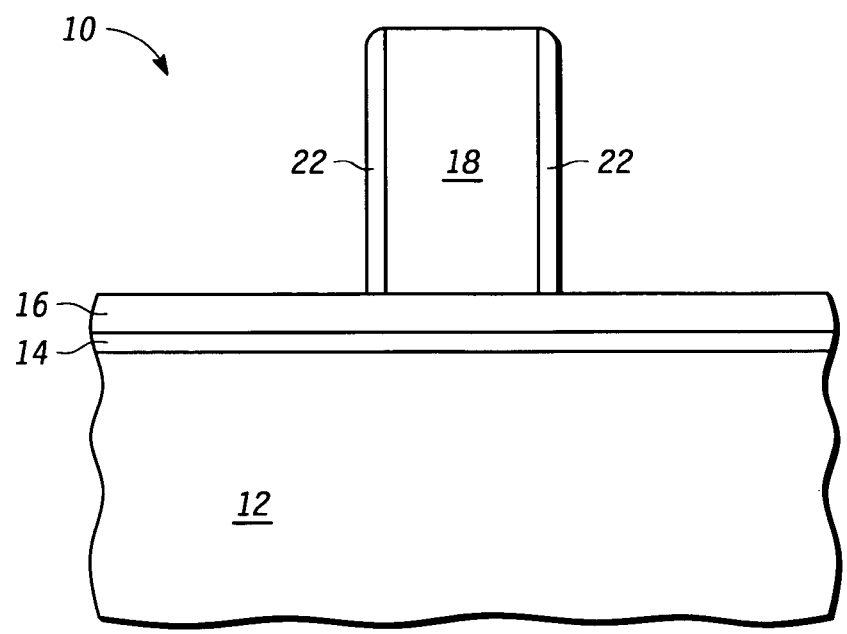
FIG. 3 is a cross section of the semiconductor structure of FIG. 2 at a subsequent stage in processing.

Shown in FIG. 3 is device structure 10 after an anisotropic etch of conformal layer 20 to leave a sidewall spacer 22 around polysilicon gate 18.

Figure 4:
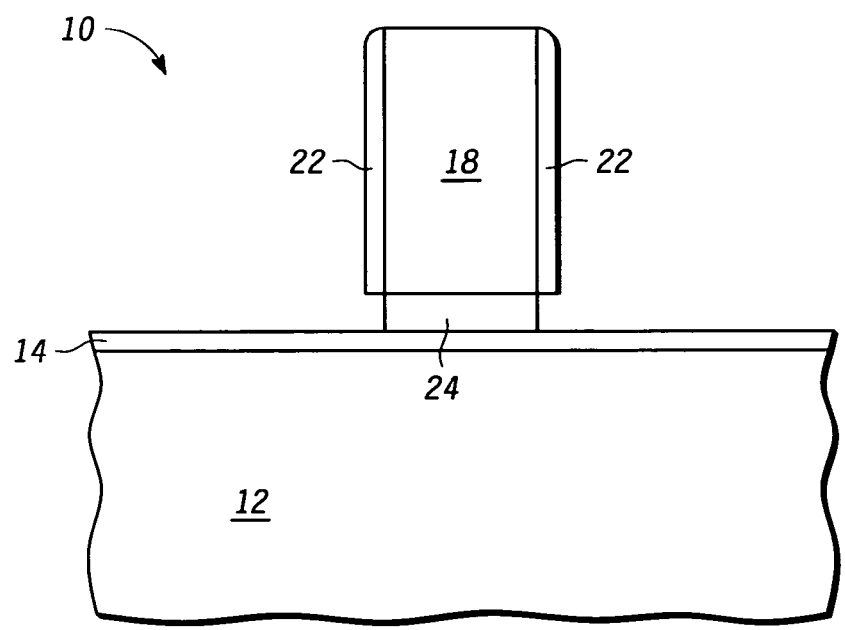
FIG. 4 is a cross section of the semiconductor structure of FIG. 3 at a subsequent stage in processing.

Shown in FIG. 4 is device structure 10 after an etch of metal layer 16 to leave a gate metal 24 under polysilicon gate 18. Polysilicon gate 18 and gate metal 24 form a gate stack. This etch is preferably performed by reactive ion etching (RIE) using difluoromethane ($CH_2F_2$) and sulfur hexafluoride ($SF_6$) on tantalum carbide and perfluoromethane ($CF_4$) and chlorine ($Cl_2$) on molybdenum nitride. When metal layer 16 is multi-layer, the etch chemistry may need to change during the etch to suit the particular metal that is then being etched. Although these etches are by RIE, they are not perfectly anistropic and attack sidewall spacer 22. These etchants, however, are minimally reactive with hafnium oxide, which is the preferred choice for sidewall spacer 22. Thus sidewall spacer 22 experiences little change and protects polysilicon gate 18 from having its profile changed. The top of polysilicon gate 18 will be etched down some but a very small amount compared to the overall thickness of polysilicon gate 18. Due to the isotropic component of these etches, metal layer 16 has a portion removed under sidewall spacer 22. The shape and amount of this undercut will vary depending on whether metal layer 16 is multiple layers and how long and under what conditions the etches are performed. Some undercutting is desirable so as to substantially align gate metal 24 with polysilicon gate 18.

Figure 5:
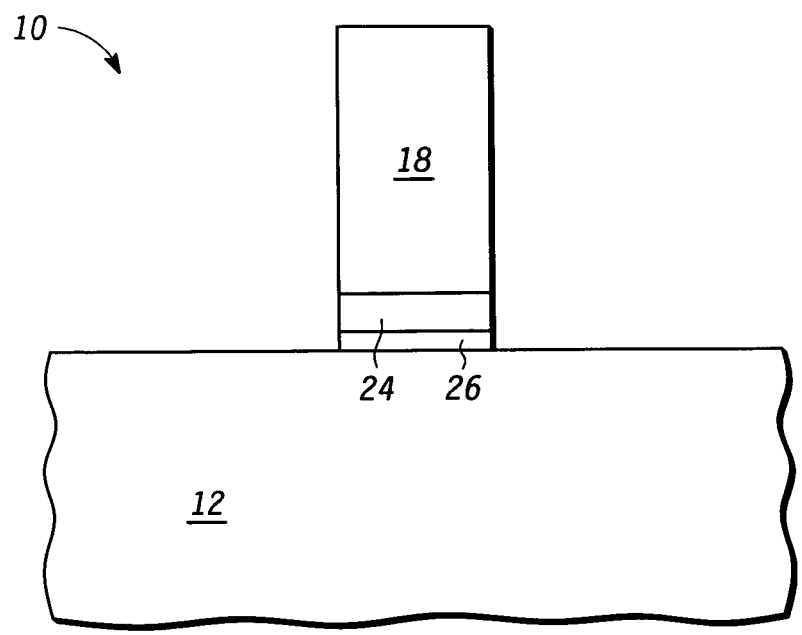
FIG. 5 is a cross section of the semiconductor structure of FIG. 4 at a subsequent stage in processing.

Shown in FIG. 5 is device structure 10 after removal of sidewall spacer 22 and the portion of insulating layer 14 not covered by gate metal 24 to leave a gate dielectric 24 under gate metal 24.

Figure 6:
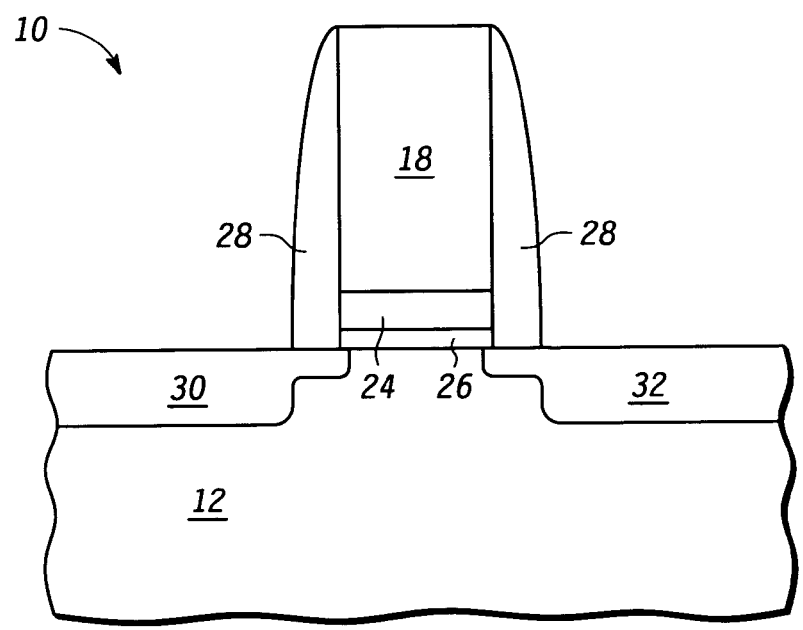
FIG. 6 is a cross section of the semiconductor structure of FIG. 5 at a subsequent stage in processing showing a completed transistor.

Shown in FIG. 6 is device structure 10 after forming a sidewall spacer 28 around the gate stack of polysilicon gate 18 and gate metal 24, a doped region 30 in substrate 12 adjacent to the gate stack on one side, and a doped region 32 on the other side of the gate stack. Doped regions 30 and 32 function as source/drains. Device structure 10 of FIG. 6 is a completed transistor that may be formed by any conventional process or even a future process not now known. In this example, sidewall spacer 22 and the portion of insulating layer 14 not masked by the gate stack are removed at the same time. Sidewall spacer 28 may, for example, comprise multiple layers and a liner.

Sidewall spacer 28, however, may be formed prior to the removal of the sidewall spacer 22 in which case the gate stack plus sidewall spacer 28 would act as the mask at the time the exposed portion of insulating layer 14 would be removed. In such case sidewall spacer 22 would not be removed.

Various changes and modifications to the embodiments herein chosen for purposes of illustration will readily occur to those skilled in the art. For example, polysicon gate 18 is presumably polysilicon but could be a different material, especially one that has sidewalls that need protection from an etch of the metal layer. The metal for N channel transistors could also be tantalum nitride, tantalum silicon nitride, and titanium nitride. Similarly for P channel devices, the metal could be a metal different than those described. Further, particular etch chemistries may also be used that are selective between the metal and the sidewall spacer present during the metal etch. This sidewall spacer was described as preferably being the same as the gate dielectric material but could be a different material, especially if the sidewall spacer is not removed prior to source/drain formation. To the extent that such modifications and variations do not depart from the spirit of the invention, they are intended to be included within the scope thereof which is assessed only by a fair interpretation of the following claims.

The invention claimed is:

1. A method of forming a semiconductor device, comprising:
   providing a semiconductor substrate;
   forming a first high-k dielectric layer over the semiconductor substrate;
   forming a metal-containing layer over the first high-k dielectric layer;
   forming a polysilicon layer over the metal-containing layer;
   patterning the polysilicon layer to form a polysilicon gate structure;
   depositing a layer of material over the polysilicon gate structure;
   etching the layer of material to form a sidewall spacer on the polysilicon gate structure and to result in an exposed portion of the metal-containing layer;
   etching the exposed portion of the metal-containing layer to form a metal gate structure; and
   forming a first doped region in the substrate on a first side of the metal gate structure and a second doped region in the substrate on a second side of the metal gate structure.

2. The method of claim 1, wherein the first high-k dielectric material comprises a metal oxide.

3. The method of claim 1, wherein the first high-k dielectric material comprises one of the group consisting of hafnium, zirconium, and silicon.

4. The method of claim 1, wherein the first high-k dielectric material is deposited at a thickness of 10-40 Å.

5. The method of claim 1, wherein the metal-containing layer comprises one of a group consisting of a PMOS metal and an NMOS metal.

6. The method of claim 1, wherein the etching the exposed portion of the metal-containing layer comprising using an etchant that is selective between the metal-containing layer and the sidewall spacer.

7. The method of claim 1, wherein the metal containing layer is deposited to a thickness of 50-100 Å.

8. The method of claim 1, wherein the layer of material is the same composition as that of the first high-k dielectric layer.

9. The method of claim 1, wherein the layer of material is deposited by atomic layer deposition (ALD).

10. The method of claim 1, wherein the layer of material is deposited to a thickness of 10-40 Å.

11. The method of claim 1, wherein the depositing the layer of material comprises conformally depositing the layer of material.

12. The method of claim 1, wherein the etching the exposed metal-containing layer is performed by reactive ion etching.

13. The method of claim 12, further comprising etching at least a portion of the metal-containing layer under the sidewall spacer.

14. A method of forming a semiconductor device, comprising:
   providing a semiconductor substrate;
   forming a first high-k dielectric layer over the semiconductor substrate;
   forming a metal-containing layer over the first high-k dielectric layer;
   forming a polysilicon layer over the metal-containing layer;

patterning the polysilicon layer to form a polysilicon gate structure;

depositing a layer of material over the polysilicon gate structrure;

etching the layer of material to form a sidewall spacer on the polysilicon gate structure;

etching the exposed metal-containing layer to form a metal gate structure;

applying an etchant to a portion of the first high-k dielectric layer using the polysilicon gate structure as a mask; and forming doped regions in the substrate adjacent to the metal gate structure.

15. The method of claim 14, wherein the etching the exposed metal-containing layer comprises applying an etchant that is selective between the metal-containing layer and the sidewall spacer by reactive ion etching.

16. The method of claim 14, wherein the metal-containing layer comprises one of a group consisting of a PMOS metal and an NMOS metal.

17. The method of claim 14, wherein the depositing the layer of material is by atomic layer deposition (ALD).

18. A method of forming a semiconductor device, the method comprising:

providing a semiconductor substrate;

providing a first high-k dielectric layer over the semiconductor substrate;

providing a metal layer over the first high-k dielectric layer, wherein the metal layer comprises a first layer of a first composition and a second layer of a second composition different from the first composition;

providing a polysilicon gate over the metal layer;

forming a sidewall spacer on sidewalls of the polysilicon gate;

applying an etchant to the sidewall spacer and the metal layer that is selective between the sidewall spacer and the metal layer to form a metal gate under the polysilicon gate; and forming doped regions in the substrate adjacent to the metal gate.

19. The method of claim 18, wherein the first material comprises one of a group consisting of oxides, carbides, borides and nitrides of a metal element.

20. The method of claim 18, wherein the forming the sidewall spacer comprises depositing a layer of material by atomic layer deposition and anisotropically etching the layer of material.

* * * * *